(12) United States Patent
Lian

(10) Patent No.: US 7,030,442 B2
(45) Date of Patent: Apr. 18, 2006

(54) STACK-FILM TRENCH CAPACITOR AND METHOD FOR MANUFACTURING THE SAME

(75) Inventor: Yu-Ying Lian, Hsinchu (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 10/965,160

(22) Filed: Oct. 15, 2004

(65) Prior Publication Data
US 2005/0062090 A1 Mar. 24, 2005

Related U.S. Application Data

(60) Division of application No. 10/331,612, filed on Dec. 31, 2002, now Pat. No. 6,821,837, which is a continuation-in-part of application No. 10/292,755, filed on Nov. 13, 2002, now abandoned.

(51) Int. Cl.
*H01L 27/108* (2006.01)

(52) U.S. Cl. ...................... 257/301; 257/311
(58) Field of Classification Search ............ 257/301, 257/311; 438/243, 386
See application file for complete search history.

(56) References Cited

U.S. PATENT DOCUMENTS

| 6,297,088 B1 | 10/2001 | King |
| 6,319,787 B1 | 11/2001 | Enders et al. |
| 6,319,790 B1 | 11/2001 | Kubota |
| 6,326,261 B1 | 12/2001 | Tsang et al. |
| 6,897,508 B1 * | 5/2005 | Sneh ..................... 257/301 |

* cited by examiner

*Primary Examiner*—Douglas W. Owens
(74) *Attorney, Agent, or Firm*—Finnegan, Henderson, Farabow, Garrett & Dunner, L.L.P.

(57) ABSTRACT

A trench capacitor includes an electrode having a first conductive area formed in a trench provided in a substrate, and a second conductive area extending from a bottom of the trench, the second conductive area being electrically coupled to the first conductive area and spaced apart from the first conductive area; a storage node having a first conductive extension extending into a first dielectric space provided between the first conductive area and the second conductive area of the electrode, and a second conductive extension extending into a second dielectric space provided within the second conductive area of the electrode; and a dielectric layer electrically insulating the electrode from the storage node.

12 Claims, 17 Drawing Sheets

US 7,030,442 B2

STACK-FILM TRENCH CAPACITOR AND METHOD FOR MANUFACTURING THE SAME

The present application is a division of application Ser. No. 10/331,612, filed Dec. 31, 2002, now U.S. Pat. No. 6,821,837 which is a continuation-in-part of application Ser. No. 10/292,755 filed on Nov. 13, 2002, now abandoned, entitled "Stack-film trench capacitor and method for manufacturing the same." The entire contents of these related applications are incorporated by reference herein.

BACKGROUND OF THE INVENTION

1. Field of the Invention

This invention pertains in general to a semiconductor device, and, more particularly, to a stack-film trench capacitor and method for manufacturing the same.

2. Description of the Prior Art

In the semiconductor industry, memory cells are among the most important integrated circuit devices and have been the source of continuing research. Continued developments have been undertaken in the industry to increase storage capacity, enhance charge retaining capability, improve writing and reading speed, and decrease device dimensions of memory cells. Many memory cells rely on capacitors as charge storage devices. For example, a dynamic random access memory (DRAM) cell generally includes a transistor and a capacitor controlled by the transistor. The capacitor is a single charge storage capacitor for storing a logical status. The transistor, which is commonly referred to as a pass transistor, controls the writing and reading of the logical status stored in the capacitor. The transistor may be a field-effect transistor (FET), and frequently, an N-channel field effect transistor (N-FET). To further illustrate the background of the related art without limiting the scope and application of the present invention, the following paragraphs describe the application of a capacitor in a DRAM.

Generally, a DRAM cell can be divided into three designs: planar, stacked-capacitor, and trench. In the planar design, the transistor and capacitor of a cell are produced as planar components. The planar design generally requires more area per memory cell than the other two designs because the capacitor and transistor occupy separate areas of a semiconductor substrate. In the stacked-capacitor design, the capacitor of a cell is disposed above the transistor to reduce the substrate area occupied by each cell. Various designs for vertically extending the capacitor have been developed in recent years. In the trench design, the transistor is disposed on the surface of a substrate, and the capacitor is disposed in a trench formed in the substrate. The trench design allows the formation of densely arranged memory cell arrays.

Generally, trench capacitors provide comparatively large capacitance while occupying a comparatively small area on a semiconductor chip surface. Trench capacitors are characterized by deep and narrow trenches formed in the semiconductor substrate. An insulator or dielectric formed on the trench walls serves as the capacitor dielectric. Generally, two capacitor electrodes are formed with the capacitor dielectric being disposed between the two electrodes. The capacitance (C) of a trench capacitor is determined as follows:

$$C = \in A/d,$$

where $\in$ is the permittivity of a capacitor dielectric, A is the surface area of the capacitor dielectric, which is disposed between the two electrodes, and d is the thickness of the capacitor dielectric, which is usually the distance between the two electrodes. From the foregoing relationship, the capacitance of a trench capacitor may be increased by providing a capacitor dielectric with a high permittivity ($\in$), forming a trench capacitor having a large surface area of a capacitor dielectric (A), or using a thin capacitor dielectric.

As the density of DRAM products increases, the space between trench capacitors decreases. Current deep trench technology has difficulties in providing satisfactory capacitance due to the strict space restrictions of modern devices. As an example, for DRAM devices of the 0.15 nm generation or beyond, especially for devices of the 0.9 nm generation or beyond, the traditional trench design has proven to be unsatisfactory in providing trench capacitors with sufficient capacitance.

SUMMARY OF THE INVENTION

Accordingly, the present invention is directed to a trench capacitor that obviates one or more of the problems due to limitations and disadvantages of the related art. The present invention also provides a method for manufacturing a trench capacitor.

Additional features and advantages of the invention will be set forth in the description which follows, and in part will be apparent from the description, or may be learned by practice of the invention. The objectives and other advantages of the invention will be realized and attained by the trench capacitor and method for manufacturing the trench capacitor particularly pointed out in the written description and claims thereof, as well as the appended drawings.

The present invention provides a trench capacitor that includes an electrode, a storage node and a dielectric layer. The electrode includes a first conductive area formed in a trench provided in a substrate, and a second conductive area extending from a bottom of the trench. The second conductive area is electrically coupled to the first conductive area and spaced horizontally apart from the first conductive area. The storage node includes a first conductive extension extending into a first dielectric space provided between the first conductive area and the second conductive area of the electrode. The storage node also includes a second conductive extension extending into a second dielectric space provided within the second conductive area of the electrode. The dielectric layer electrically insulates the electrode from the storage node.

Also in accordance with the present invention, a trench capacitor is provided. The trench capacitor is formed in a trench within a semiconductor substrate and includes an electrode, a storage node, and a dielectric layer. The electrode has a double-crown structure that includes an outer conductive crown comprising a doped semiconductor substrate and an inner conductive crown spaced apart from the outer conductive crown. The inner conductive crown is electrically coupled to the outer conductive crown. The storage node extends into a first dielectric space formed between the outer conductive crown and the inner conductive crown, and also extends into a second dielectric space formed within the inner conductive crown. The dielectric layer electrically insulates the electrode from the storage node.

Still in accordance with the present invention, a trench capacitor is provided. The trench capacitor is formed in a trench within a semiconductor substrate and includes an electrode, a dielectric layer, and a storage node. The electrode has a plurality of electrode prongs. Each of the electrode prongs is electrically coupled to the other electrode prongs, and at least one electrode prong is comprised of a portion of a doped substrate. The storage node has a plurality of storage node prongs, with each of the storage node prongs being electrically coupled to the other storage node prongs. At least one of the storage node prongs extends into a dielectric space provided between two of the plurality of electrode prongs. The dielectric layer electrically insulates the electrode from the storage node.

The present invention also provides a method for manufacturing a trench capacitor. The method includes forming a trench within a substrate; doping the substrate to form a first conductive area; forming a first dielectric layer to electrically insulate the first conductive area; forming a second conductive layer contiguous with the first dielectric layer; forming a second dielectric layer contiguous with the second conductive layer; removing a bottom portion of the first dielectric layer, the second conductive layer, and the second dielectric layer; forming a third conductive layer in the trench to electrically couple to the first conductive area; electrically insulating the third conductive layer; removing an upper sidewall portion of the first dielectric layer, the second conductive layer, the second dielectric layer, and the third conductive layer; forming a fifth dielectric layer on an upper sidewall of the trench; forming a fourth conductive layer in a lower portion of the trench; and forming a fifth conductive layer on the fourth conductive layer in the trench to electrically couple the fourth conductive layer and the second conductive layer.

Still in accordance with the present invention, a method for manufacturing a trench capacitor is provided. The method includes providing a first conductive area of an electrode in a substrate surrounding a trench; providing a second conductive area of the electrode, the second conductive area comprising at least a vertical wall extending from a bottom of the trench, the second conductive area being electrically coupled to the first conductive area and spaced apart from the first conductive area; providing a first conductive extension of a storage node, the first conductive extension extending into a first dielectric space provided between the first conductive area and the second conductive area of the electrode; providing a second conductive extension of a storage node, the second conductive node extending into a second dielectric space provided within the second conductive area of the electrode; and providing a dielectric layer electrically insulating the electrode from the storage node.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings,

FIGS. 3–17A show the cross-sectional views of a method for manufacturing a trench capacitor consistent with one embodiment of the present invention.

DESCRIPTION OF THE EMBODIMENTS

Reference will now be made in detail to the embodiments of the invention, examples of which are illustrated in the accompanying drawings. Wherever possible, the same reference numbers will be used throughout the drawings to refer to the same or like parts.

The present invention provides a stack-film trench capacitor for a memory cell and a method for manufacturing a stack-film trench capacitor. The trench capacitor, consistent with one embodiment of the present invention, includes a double-crown trench structure with increased electrode and storage node areas. Specifically, the trench capacitor and the method of the present invention provide a stacked structure of multiple conductive and dielectric films to increase the capacitor area and provide high capacitance without significantly increasing the dimension of the trench.

Figure 1:
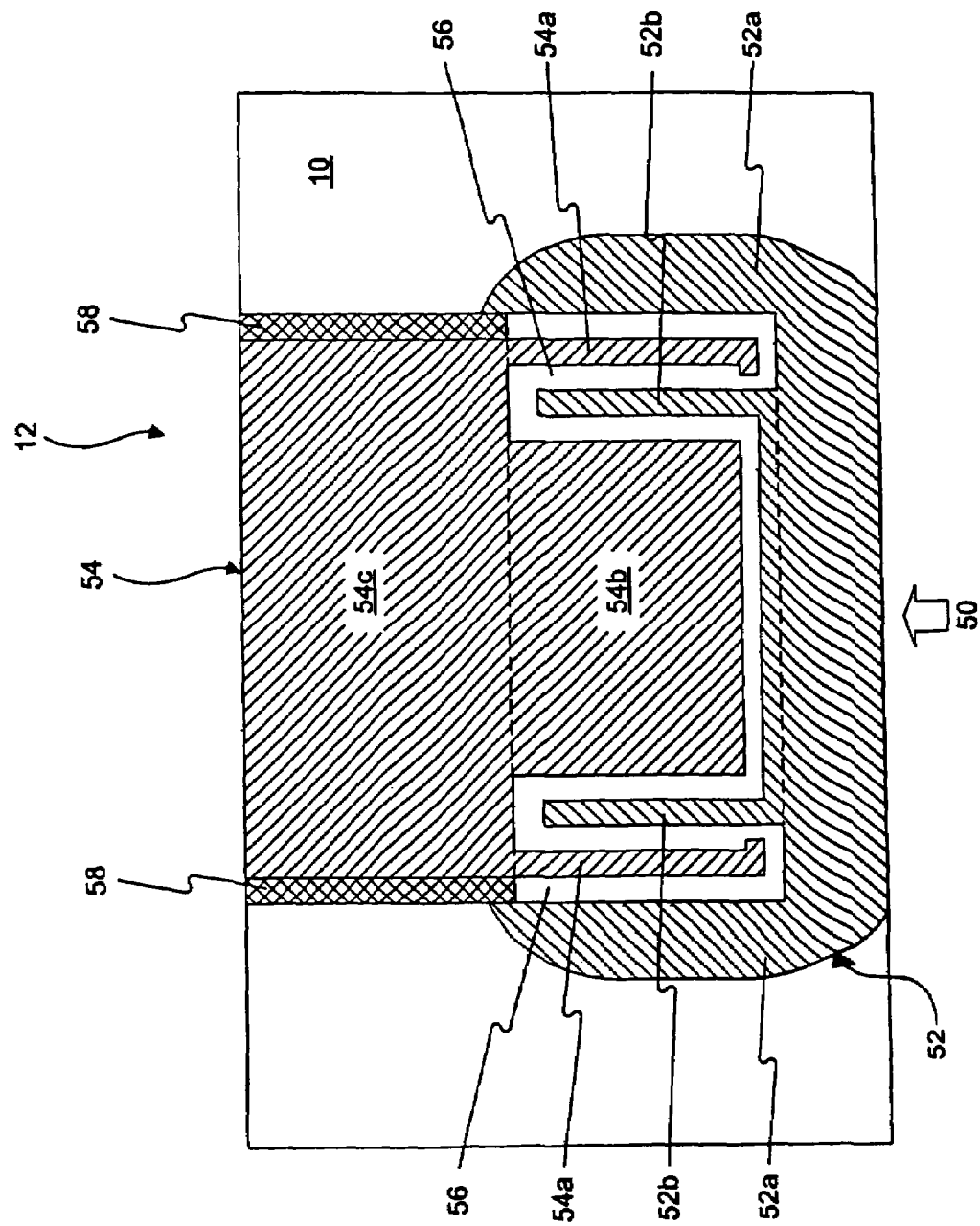
FIG. 1 shows a cross-sectional view of a trench capacitor consistent with one embodiment of the present invention.
Figure 2:
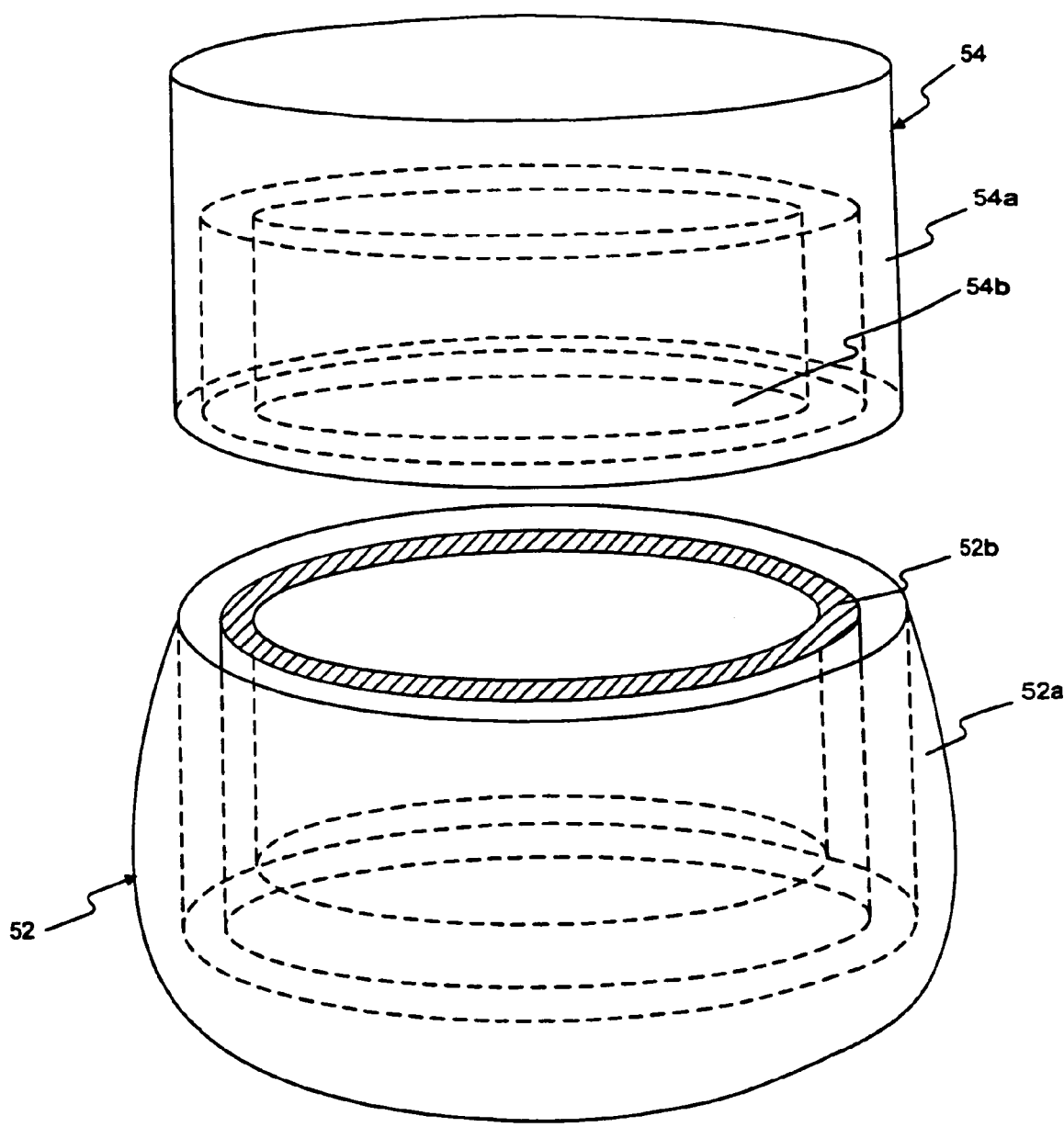
FIG. 2 shows a perspective view of a trench capacitor consistent with one embodiment of the present invention.

FIG. 1 is a cross-sectional view of one embodiment of the trench capacitor consistent with the present invention. FIG. 2 provides a perspective view of another embodiment of the trench capacitor consistent with the present invention, with the electrode and storage separated to illustrate their structures. A trench capacitor 50 includes an electrode 52, a storage node 54, and a dielectric layer 56 disposed between electrode 52 and storage node 54 to electrically insulate electrode 52 from storage node 54. FIGS. 1 and 2 are presented for the purpose of illustrating the general structure and relative locations of different parts of two embodiments of the trench capacitor consistent with the present invention. These two drawings and the drawings discussed below merely serve to illustrate the present invention without any intent to limit the scope of the present invention. It is noted that these drawings do not necessarily reflect the exact size, shape, or aspect ratio of the trench capacitor and its components.

Referring to FIGS. 1 and 2, electrode 52, or first electrode, may be viewed as having a double crown structure, or a crown structure that has a vertical extension inside. An outer crown 52a is electrically coupled to an inner crown or vertical extension 52b. Inner crown or vertical extension 52b is spaced horizontally apart from outer crown 52a. Outer crown 52a can be made of a doped silicon substrate 10 that surrounds a trench. Inner crown or vertical extension 52b can be a conductive material that extends from the bottom of trench 12 and forms a loop in the shape of a vertical wall, as shown in FIG. 2.

Storage node 54, or second electrode, may provide a first extension or protrusion 54a that extends into the space between outer crown 52a and inner crown or vertical extension 52b, as shown in FIGS. 1 and 2. Storage node 54 may also provide a second extension or protrusion 54b that extends into the space inside inner crown or vertical extension 52b. First extension 54a and second extension 54b are made from one or more conductive materials.

Referring to FIG. 1, trench capacitor 50 has a dielectric layer 56 that electrically insulates electrode 52 from storage node 54. Dielectric layer 56 fills the space between electrode 52 and storage node 54. In this embodiment, dielectric layer 56 is contiguous with electrode 52. Storage node 54 may be contiguous with dielectric layer 56. Dielectric layer 56 may be comprised of one or more dielectric materials. In addition, trench capacitor 50 may also include a collar 58 that surrounds the upper sidewall of storage node 54 to electrically insulate storage node 54 from semiconductor substrate 10.

Referring to FIG. 1, storage node 54 may be viewed alternatively as having a U-shaped cross-section with four electrode prongs 52a and 52b. Each of the electrode prongs electrically couples to other electrode prongs. In this embodiment, two outer electrode prongs 52a of U-shaped electrode 52 are formed by a doped silicon area in substrate 10.

Accordingly, storage node 54 may also be viewed as having an upside down, U-shaped cross-section with three storage node prongs 54a and 54b. Each of the storage node prongs electrically couples to the other storage node prongs. For example, middle storage node prong 54b is electrically coupled to two outer storage node prongs 54a. A base portion 54c electrically couples to prongs 54a and 54b in this embodiment. In forming trench capacitor 50, each of the storage node prongs extends into a dielectric space between two of the four electrode prongs. Two storage node prongs 54a, therefore, extend into the dielectric spaces provided between two electrode prongs 52a and two electrode prongs 52b. Storage node prongs 54b extend into the dielectric space provided within two electrode prongs 52b. In one embodiment, storage node prong 54b in the middle is much wider than two outer storage node prongs 54a. Dielectric layer 56 and collar 58 are configured as discussed above.

Although the present invention has been described in FIGS. 1 and 2 principally in a circular or elliptical shape, it should be appreciated that the invention is equally applicable for providing a trench capacitor in any geometric shape, such as a square, rectangular, pentagon, hexagon, and octagon. For example, although first extension 54a and second extension 54b in the illustrated example have a circular or elliptical shape, they may vary their shapes according to the shape of electrode 52, which may be configured to various shapes depending how a trench is defined in a substrate.

Figure 3:
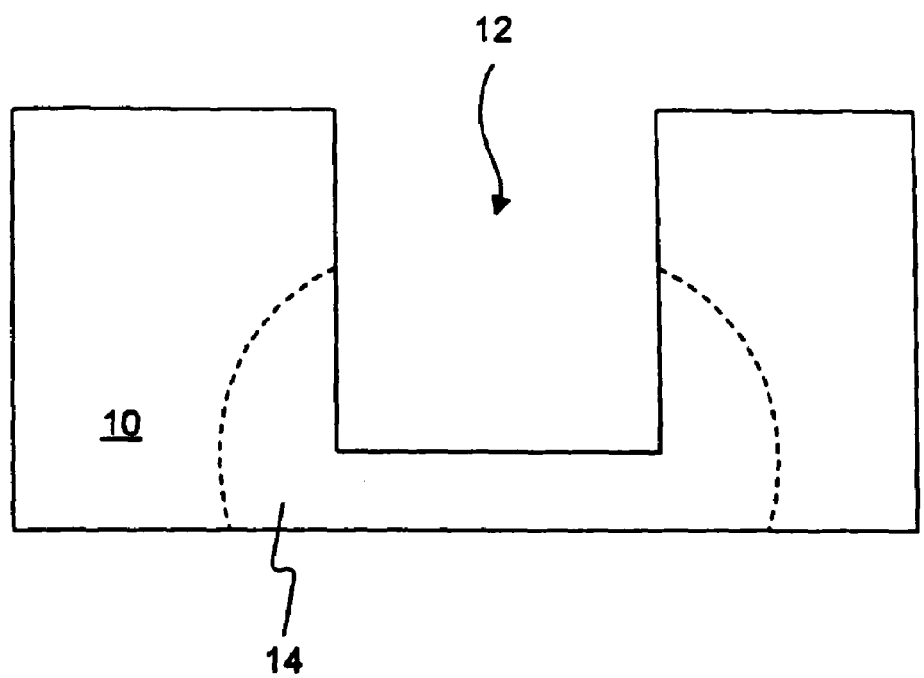

FIG. 3 shows the cross-sectional view of substrate 10 that provides a foundation for forming semiconductor devices. In one embodiment, substrate 10 is a silicon substrate, such as a p-doped single crystal silicon substrate. The method of the present invention starts by defining substrate 10 and forming a trench 12 within substrate 10. As an example, photolithographic techniques are applied to define the trench area, and an anisotropic etch, such a reactive ion etch (RIE) or high density plasma (HDP) etch, is employed to remove portions of substrate 10 to form trench 12. Trench 12 may be defined to exhibit a circular or elliptic shape from a top view of substrate 10. Trench 12 may also be defined to have other geometric shapes, such as square, rectangular, pentagon, hexagon, and octagon.

A first conductive area 14 may be formed within substrate 10. First conductive area 14 serves as a portion of the electrode of a trench capacitor. First conductive area 14 may be a doped silicon area. In one embodiment, a doping or diffusion process is used to place impurities, such as arsenic, into at least a portion of the sidewalls and the bottom of trench 12. The impurities diffuse into substrate 10 and render the sidewalls and bottom of trench 12 conductive. First conductive area 14, therefore, is formed inside substrate 10 and substantially surrounds trench 12.

In addition, a thin layer of sacrificial thermal oxide (not shown) may be optionally grown on the surface of trench 12 to repair silicon damage caused by the high-energy ions during doping of impurities and RIE or HDP etch to provide smooth trench sidewalls. A thermal oxidation process for forming the silicon oxide may also facilitate the diffusion of the doped impurities in substrate 10 for forming first conductive area 14. This sacrificial thermal oxide layer may be removed with a diluted hydrogen fluoride (HF) solution.

Figure 4:
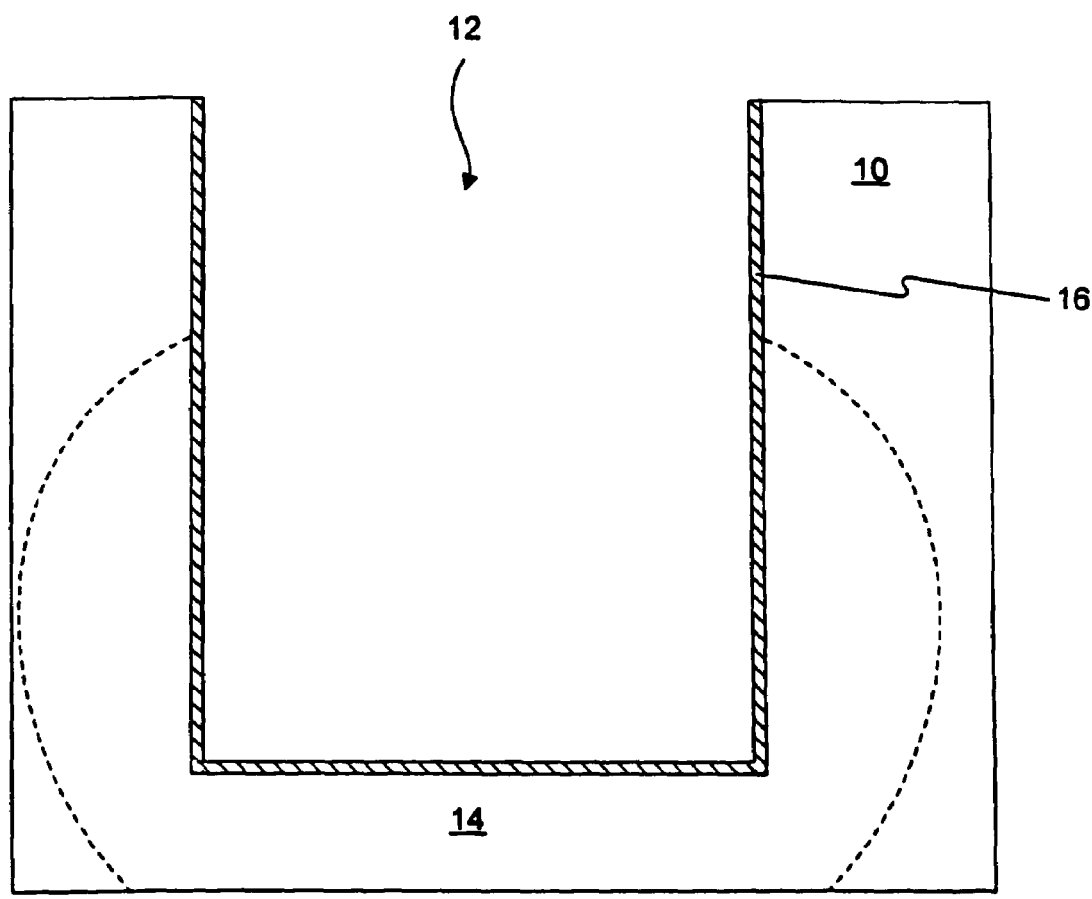

Referring to FIG. 4, first conductive area 14 is electrically insulated from a subsequently-formed conductive layer by a first dielectric layer 16. First dielectric layer 16 is substantially conformal to cover the surface of trench 12, or contiguous with the exposed area of first conductive area 14. A chemical vapor deposition (CVD) or low pressure CVD (LPCVD) process may be used to deposit a thin film of dielectric, such as silicon nitride ($SiN_x$), stacked silicon nitride and silicon oxide (NO), silicon oxynitride ($Si_2N_2O_x$), aluminum oxide ($Al_2O_3$), tantalum oxide ($Ta_2O_5$), titanium oxide($TiO_2$), or any other dielectric materials with high dielectric constants (high K values). The use of dielectrics like $Al_2O_3$, $Ta_2O_5$, and $TiO_2$ suppresses the tunneling of electrons for thin films, reduces leakage current, delivers a high dielectric constant, and provides a thermally stable, uniform, and high quality film. These dielectric materials are also applicable to other dielectric layers of the present invention illustrated below.

Generally, advanced deposition technologies, such as atomic layer chemical vapor deposition (ALCVD), synchronized plasma atomic layer deposition (SPALD), plasma enhanced atomic layer deposition (PEALD), and molecular beam epitaxy (MBE), may be employed to deposit a high quality, thin film dielectric having a thickness of approximately 30 to 150 angstroms. The thickness can be varied within or outside the range according to various factors, including, but not limited to, the dielectric material used and the desired capacitance of the trench capacitor.

Figure 5:
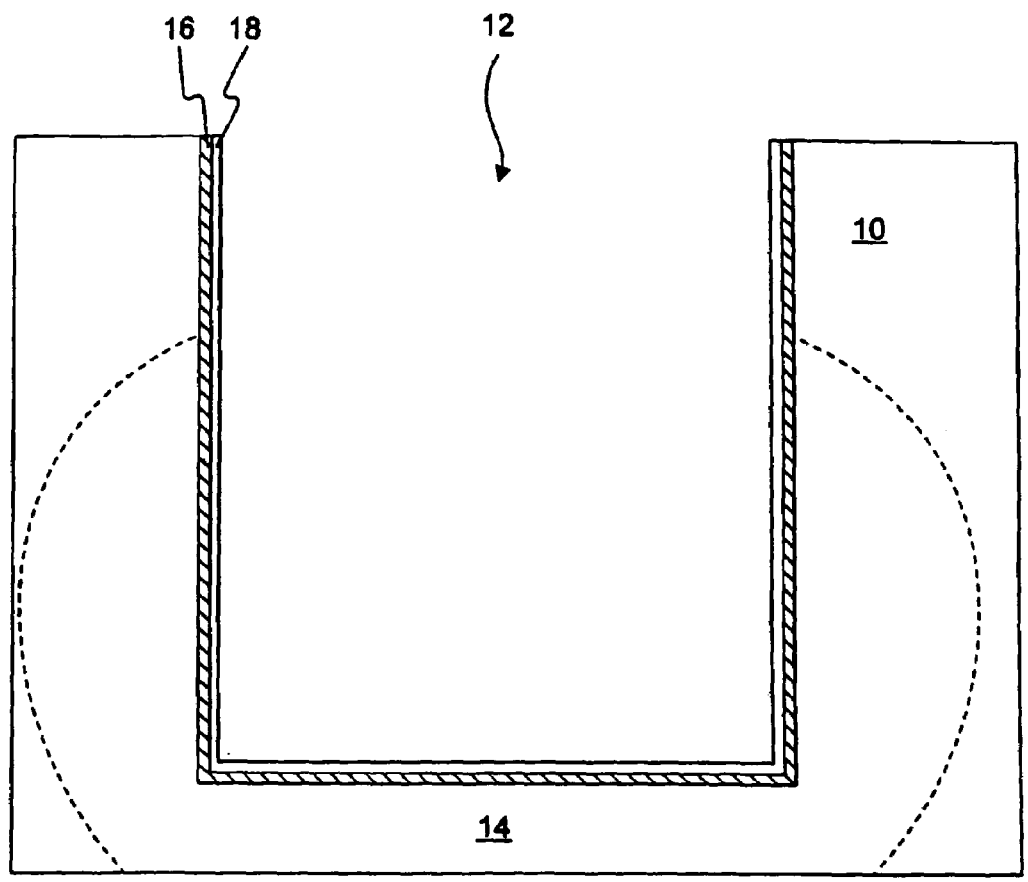

Referring to FIG. 5, a second conductive layer 18 is formed on, and contiguous, with first dielectric layer 16. Second conductive layer 18 serves as a portion of the storage node of the trench capacitor and may be composed of any conductive material. For example, TiN, doped polysilicon, or other conductive materials, can be provided by deposition, such as CVD, LPCVD, pulse plasma CVD, ALCVD, SPALD, PEALD, or MBE. In addition, an optional annealing process may be added following deposition. The use of materials like TiN for the second conductive layer 18 provides good adhesion to neighboring silicon materials, improved thermal stability, and improved interface characteristics with $Al_2O_3$ or stacked silicon nitride and oxide materials.

Figure 6:
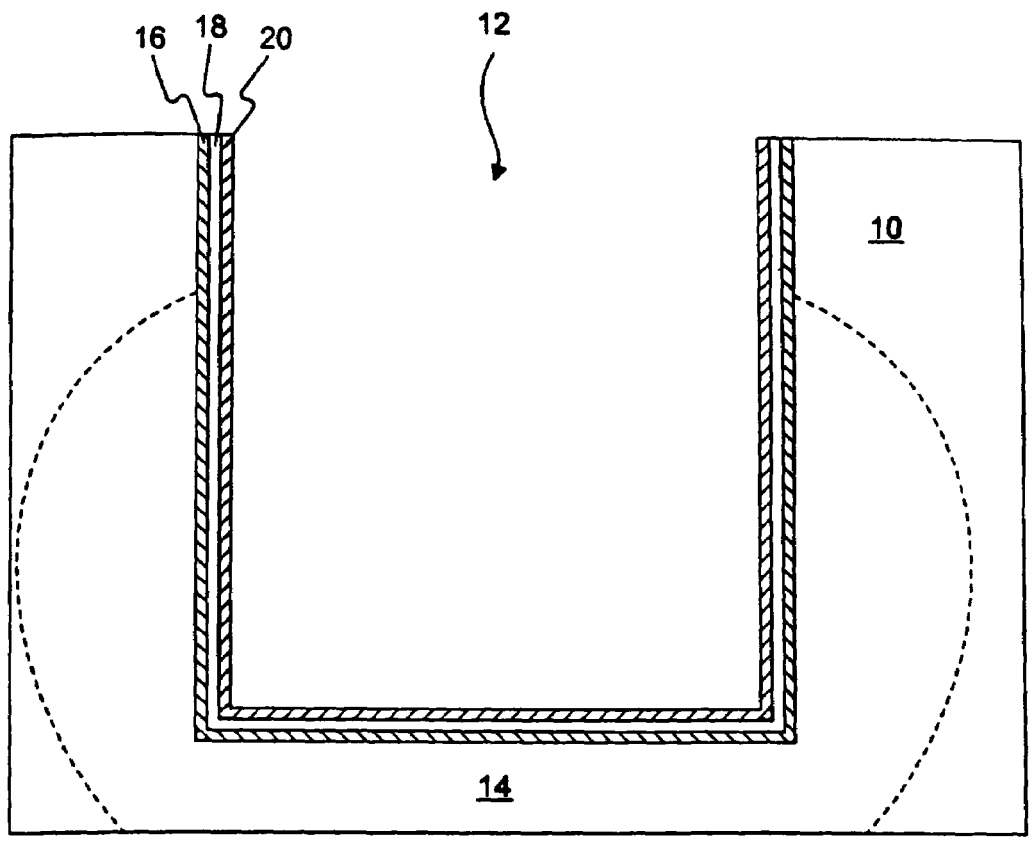

Referring to FIG. 6, a second dielectric layer 20 is formed on and contiguous with second conductive layer 18. CVD or LPCVD may be used to deposit a thin film of dielectric, such as silicon nitride ($SiN_x$), stacked silicon nitride and silicon oxide (NO), silicon oxynitride ($Si_2N_2O_x$), aluminum oxide ($Al_2O_3$), tantalum oxide ($Ta_2O_5$), titanium oxide($TiO_2$), or other dielectric materials with high dielectric constants (high K values), to form second conductive layer 18. As described above, advanced deposition technologies, such as ALCVD, SPALD, PEALD, and MBE, may be employed to deposit a high quality, thin film dielectric having a thickness of approximately 30 to 150 angstroms. The thickness can be varied within or outside the range according to various factors, such as the dielectric material used and desired capacitance of the trench capacitor.

Figure 7:
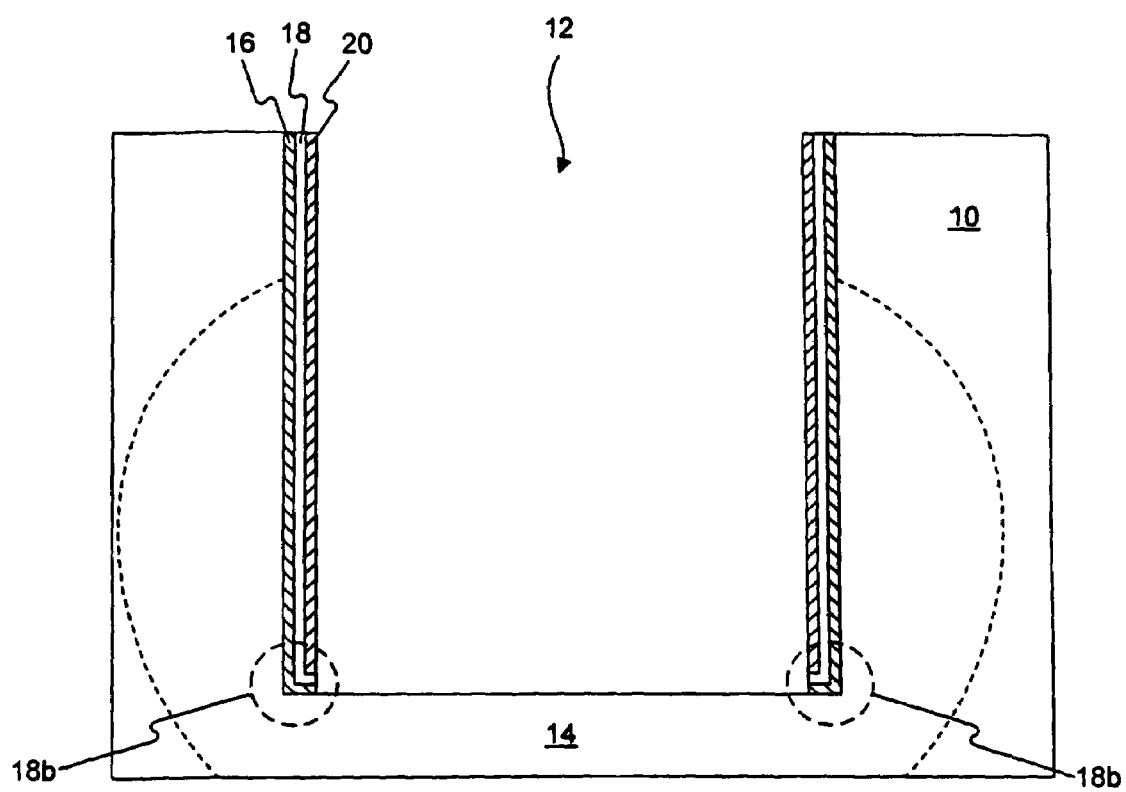

Referring to FIG. 7, first dielectric layer 16, second conductive layer 18, and second dielectric layer 20 provided at the bottom of trench 12 are removed while the sidewall portions of first dielectric layer 16, second conductive layer 18, and second dielectric layer 20 are retained. An anisotropic etch may be employed to remove the bottom portion of the three-layer structure of first dielectric layer 16, second conductive layer 18, and second dielectric layer 20 without damaging the sidewall portions of the three-layer structure. An anisotropic etch, such as RIE or HDP etch, removes the three-layer structure provided at the bottom of trench 12. Due to the removal of the bottom portion of the three-layer structure, certain areas of second conductive layer 18 may be exposed.

Figure 8:
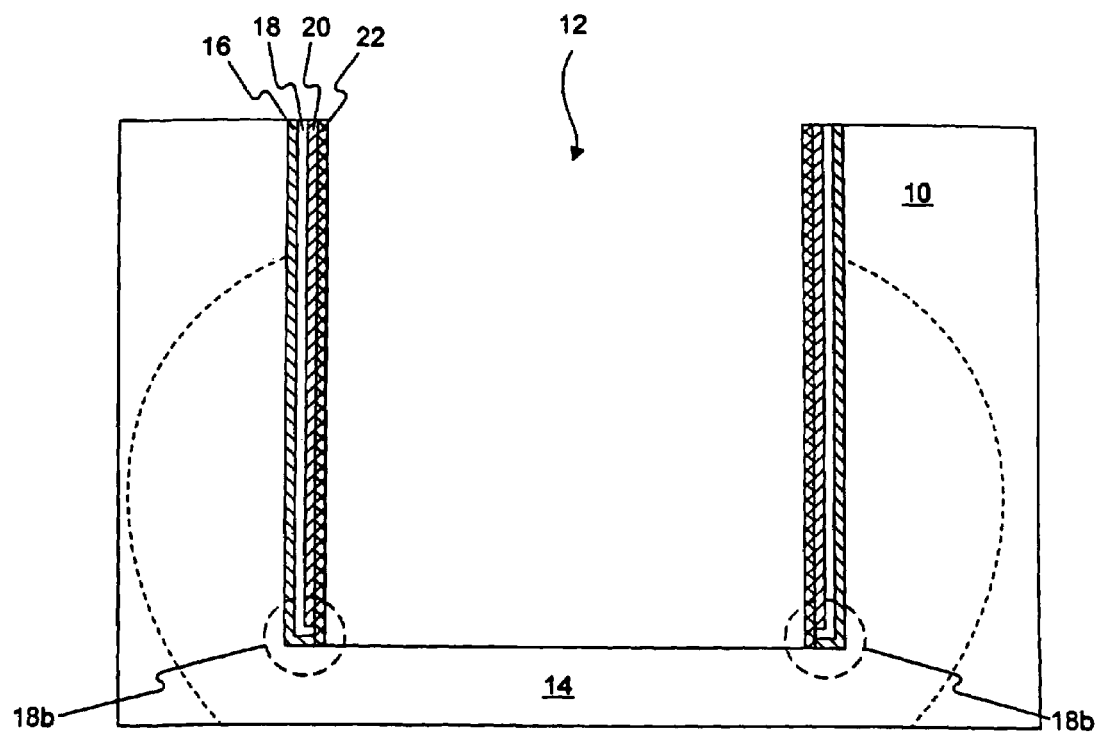

Referring to FIG. 8, exposed areas 18b of second conductive layer 18 are electrically insulated by a dielectric or electrically insulating material formed thereon. In one embodiment, a third dielectric layer 22 is formed on the sidewalls of trench 12 to electrically insulate exposed areas 18b. Third dielectric layer 22 covers exposed areas 18b of second conductive layer 18 and is contiguous with the sidewalls of second dielectric layer 20. As a result, third dielectric layer 22 may serve as an additional dielectric layer between the electrode and storage node of the trench capacitor.

Third dielectric layer 22 may be formed by a deposition process to cover the surfaces of trench 12 with another dielectric layer, followed by an etch to remove the dielectric at the bottom of trench 12. This dielectric layer may be provided by the same deposition process as described for second dielectric layer 20, and may be comprised of the same material as second dielectric layer 20. At least portions of second dielectric layer 20 and third dielectric layer 22 may be considered a single dielectric layer.

After the deposition process, the bottom portion of the deposited dielectric is removed to allow first conductive area 14 to be electrically coupled to a subsequently-formed conductive layer. The sidewall portions of the deposited dielectric are retained to electrically insulate second conductive layer 18. An etch may be used to remove the bottom portion of the deposited dielectric without damaging the materials on the sidewalls of trench 12. The present invention may apply an anisotropic etch, such as RIE and HDP etch, to remove the bottom portion of the deposited dielectric while retaining the deposited dielectric on the sidewalls. As an example, third dielectric layer 22 has a thickness of approximately 30 to 150 angstroms. The thickness can be varied within or outside the range according to various factors, including, but not limited to, the thickness of second dielectric layer 20, the dielectric material used, and the desired capacitance of the trench capacitor.

Figure 9:
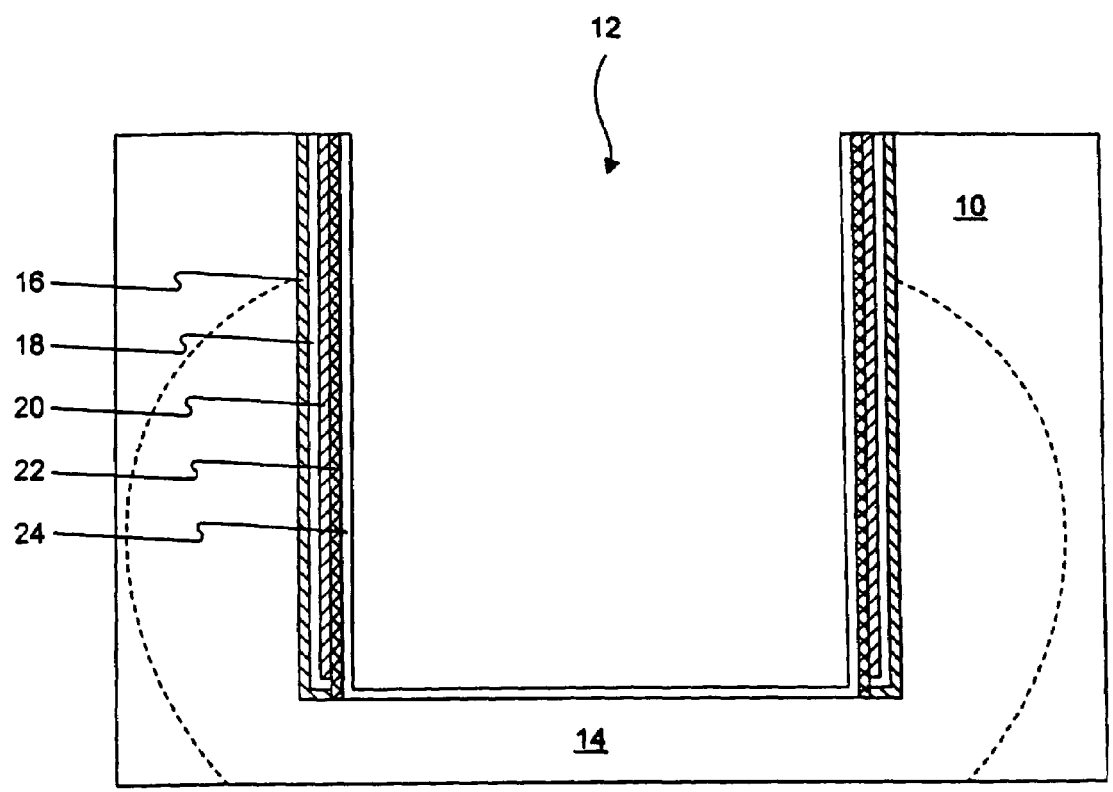

A third conductive layer 24 is formed in trench 12, as shown in FIG. 9. As an example, third conductive layer 24 may be a conductive layer that covers the sidewalls and the bottom of trench 12. Third conductive layer 24 is electronically insulated from second conductive layer 18 by third dielectric layer 22 and second dielectric layer 20. Third conductive layer 24 in this embodiment is formed contiguous with and electrically coupled to first conductive area 14 to serve as a portion of the electrode of the trench capacitor. As an example, polysilicon may be deposited and doped to form third conductive layer 24. The deposition process may be performed with any of LPCVD, CVD, pulse plasma CVD, ALCVD, SPALD, PEALD, and MBE. In one embodiment, the deposition uses SiH₄ as the reactant gas and in-situ deposition to dope an N-type dopant, such as phosphorus, to form third conductive layer 24.

Figure 10:
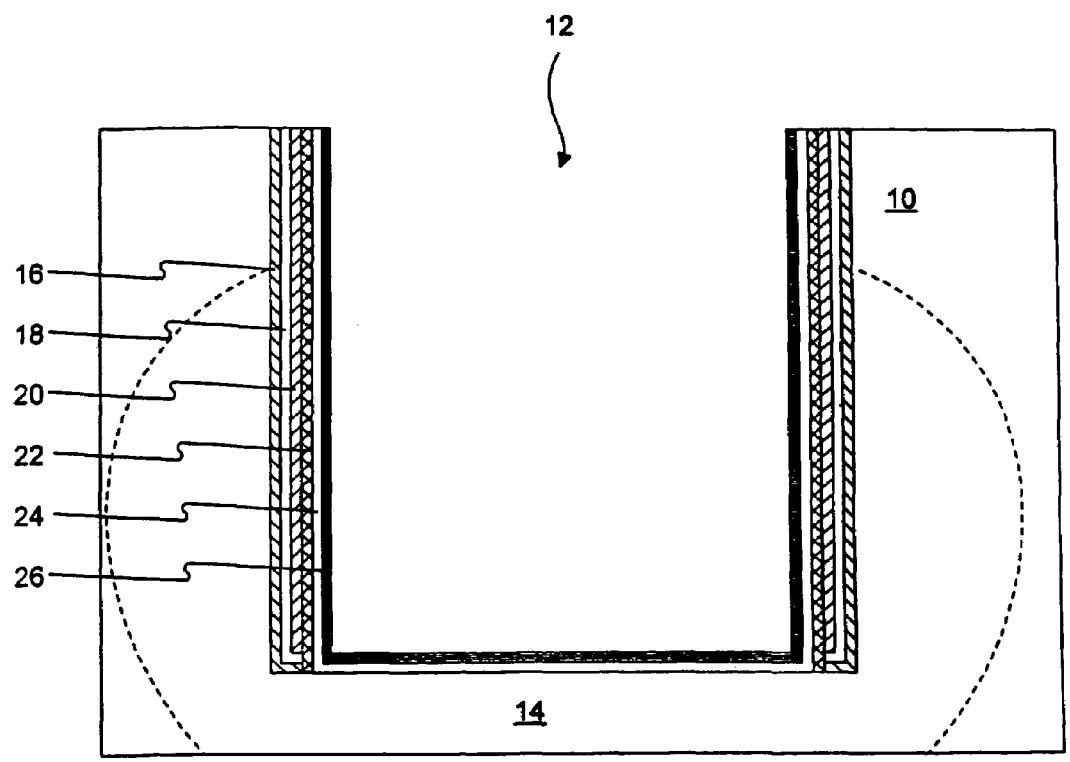

Referring to FIG. 10, third conductive layer 24 is electrically insulated from another conductive layer to be formed later. As an example, a fourth dielectric layer 26 is formed contiguous with third conductive layer 24 to electrically insulate the electrode, including first conductive area 14 and third conductive layer 24, from the storage node, including second conductive layer 18 and one or more subsequently-formed conductive layers. Fourth dielectric layer 26 may be formed by depositing a dielectric layer in trench 12. The deposition process includes any of CVD, LPCVD, pulse plasma CVD, ALCVD, SPALD, PEALD, and MBE to deposit a thin film of dielectric, such as silicon nitride ($SiN_x$), stacked silicon nitride and silicon oxide (NO), silicon oxynitride ($Si_2N_2O_x$), aluminum oxide ($Al_2O_3$), tantalum oxide ($Ta_2O_5$), titanium oxide ($TiO_2$), and other dielectric materials with high dielectric constants (high K values).

Figure 11:
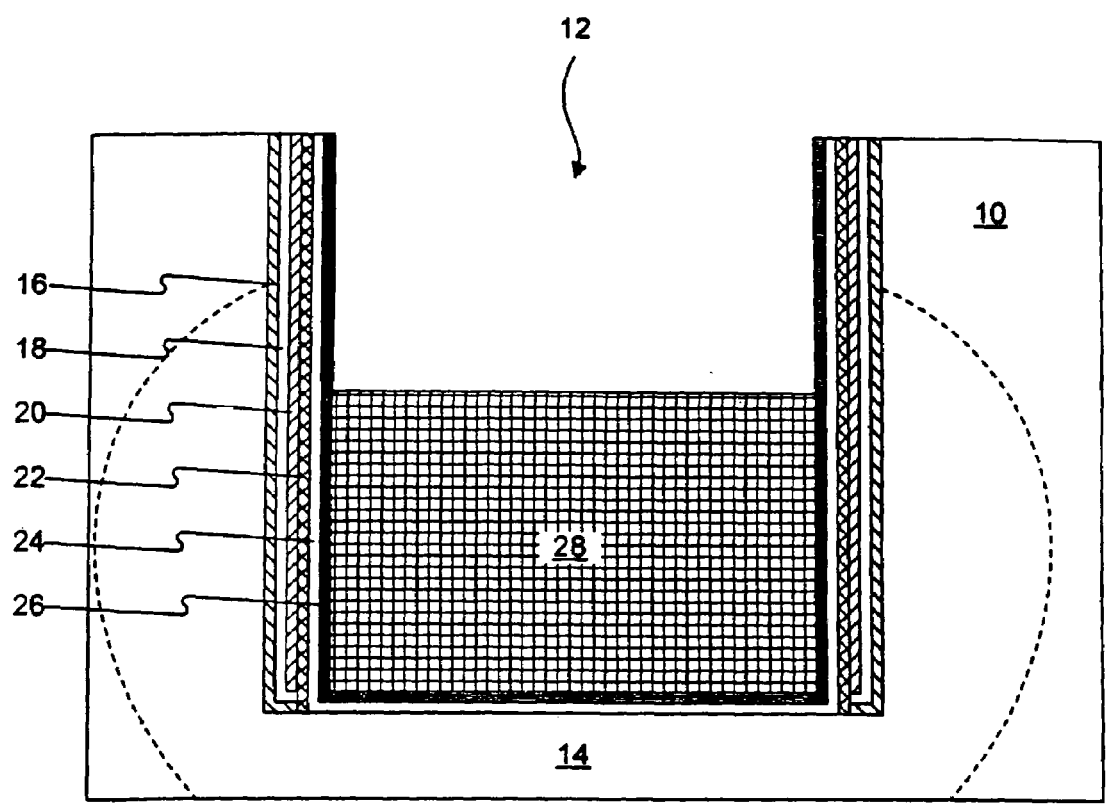
Figure 12:
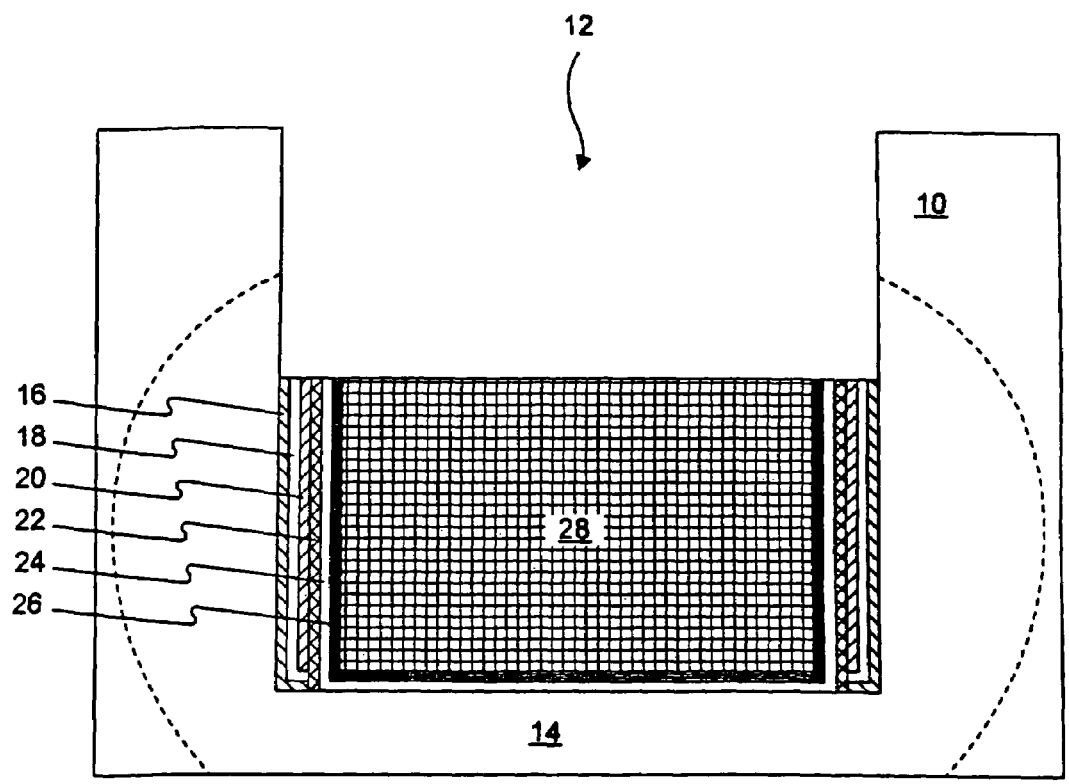

Referring to FIG. 12, the multilayer structure of first dielectric layer 16, second conductive layer 18, second dielectric layer 20, third dielectric layer 22, third conductive layer 24, and fourth dielectric layer 26 on the upper sidewalls of trench 12 is etched. FIG. 11 illustrates an embodiment where a protective layer 28 is provided inside trench 12, covering at least a portion of the multilayer structure. Protective layer 28 may be a photoresist that fills the lower part of trench 12 to a predetermined depth less than the entire depth of trench 12.

Figure 13:
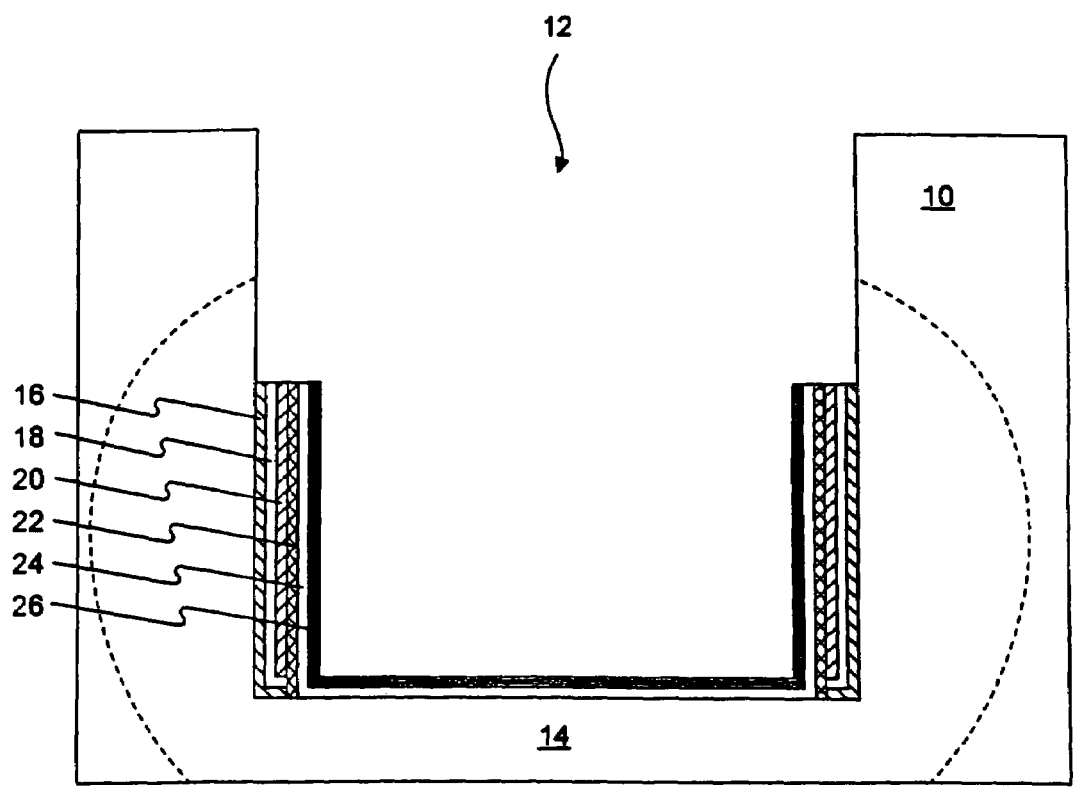

Referring to FIG. 12, one or more isotropic etches, such as a wet etch, may be used to remove the upper sidewall materials. Protective layer 28 is then removed, as shown in FIG. 13. Both second conductive layer 18 and third conductive layer 24 have exposed areas on their top surfaces after the upper sidewall materials are removed.

Referring to FIG. 13, the upper sidewall portions of the multilayer structure are removed. One of the many purposes of removing the upper sidewall portions of the multilayer structure is to allow for the subsequent formation of a collar on the upper sidewalls of trench 12. The depth of the layers removed may depend on various factors, such as the material and dimension of the collar, dimension of the trench, materials in the trench and thicknesses of those materials, and desired effects of the collar.

Figure 14:
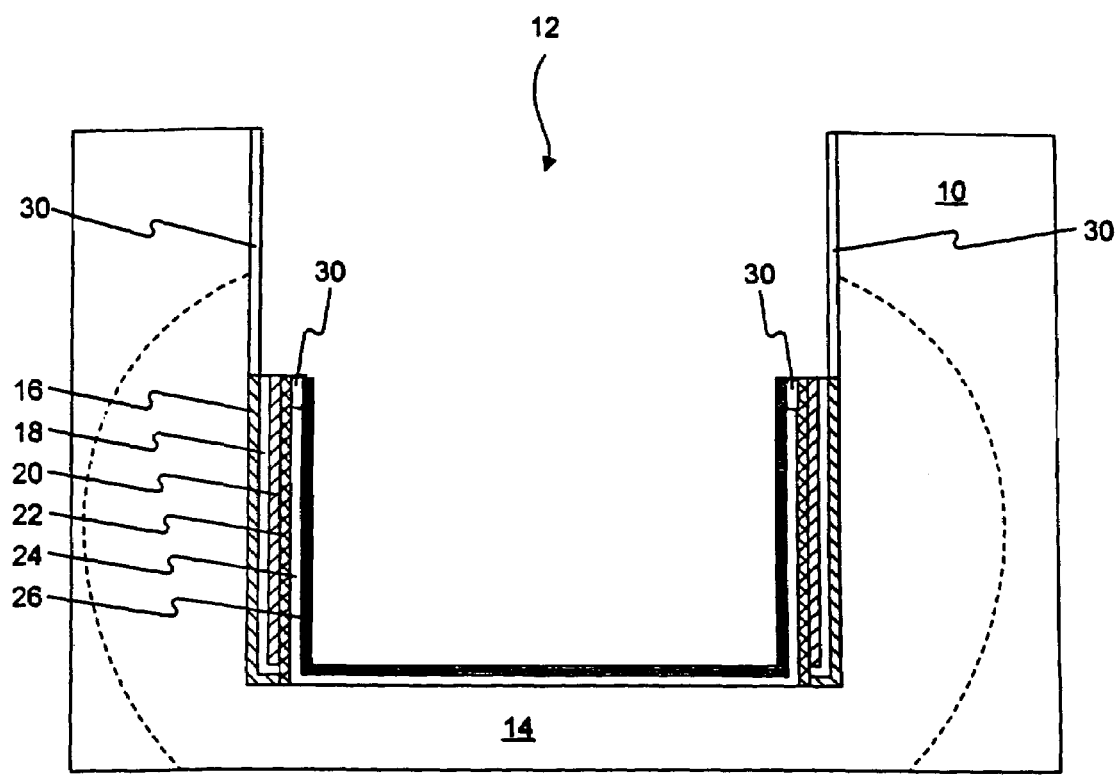

Referring to FIG. 14, a fifth dielectric layer 30 is formed on the upper sidewalls of trench 12. Fifth dielectric layer 30 in the illustrated example may extend from the top of the trench sidewalls to first dielectric layer 16. In addition, an exposed area on top of third conductive layer 24 is electrically insulated from another conductive material to be formed later. In one embodiment, the exposed area of third conductive layer 24 may be covered by fifth dielectric layer 30. Fifth dielectric layer 30 electrically insulates the electrode of the trench capacitor from the storage node.

Fifth dielectric layer 30 may be comprised of silicon oxide formed by a thermal oxidation process. If third conductive layer 24 contains silicon, the thermal oxidation also grows silicon oxide on the exposed portions of third conductive layer 24. Alternatively, a deposition process may be used to form fifth dielectric layer 30, but additional etching steps may be required to remove the dielectric deposited on other areas of trench 12.

Depending on how fifth dielectric layer 30 is formed, an additional removal process may be required to expose top portions of second conductive layer 18 to allow conductive coupling with another conductive material to be formed later. The removal process involves removing a dielectric material on top of second conductive layer 18. For example, if second conductive layer 18 contains TiN and thermal oxidation was performed to form fifth dielectric layer 30, a thin layer of oxide would have formed on top of the TiN layer due to thermal oxidation. An etch, such as an anisotropic dry etch, may be used to remove the oxide material to expose the top conductive surfaces of second conductive layer 18.

Figure 15:
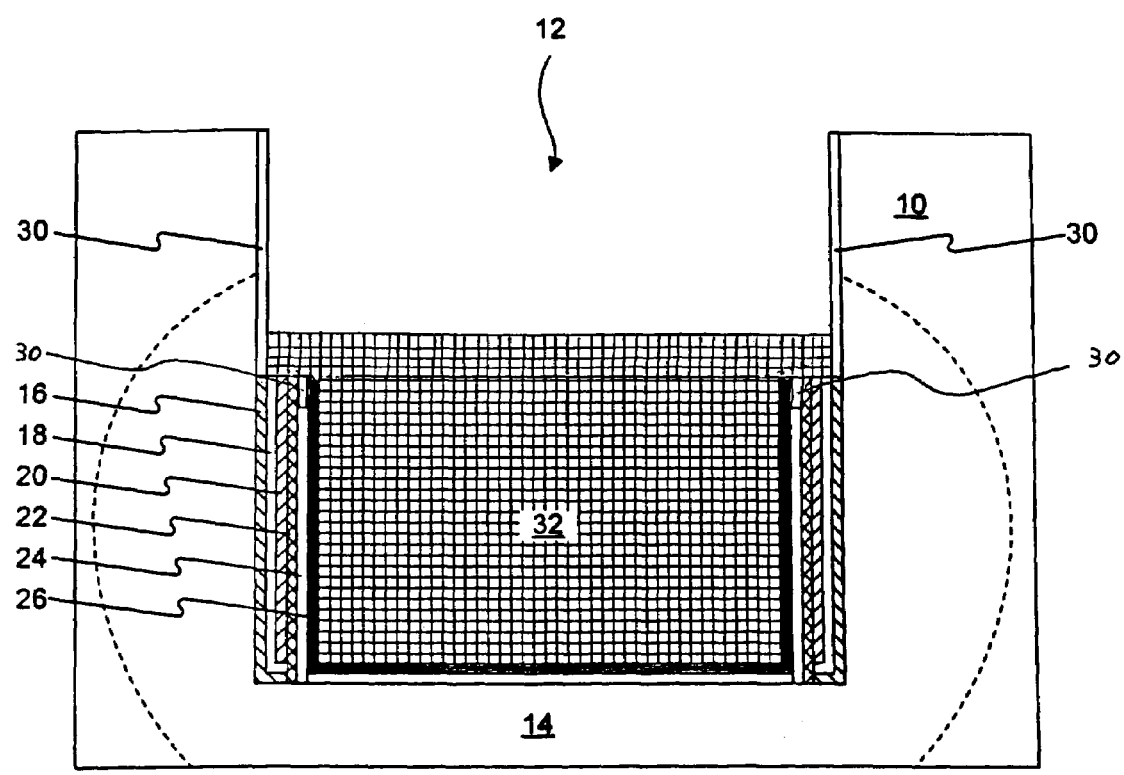

Referring to FIG. 15, a fourth conductive layer 32 is provided in the lower portion of trench 12. As an example, fourth conductive layer 32 may fill the lower portion of trench 12 to a level above the multilayer sidewall structure. The multilayer sidewall structure includes first dielectric layer 16, second conductive layer 18, second dielectric layer 20, third dielectric layer 22, third conductive layer 24, and fourth dielectric layer 26. Fourth conductive layer 32 serves as a portion of the storage node for the trench capacitor and its level may vary depending on different designs. The structures in FIG. 15 and other figures merely serve as exemplary embodiments. In the illustrated example, fourth conductive layer 32 conductively couples with second conductive layer 18.

As an example, polysilicon may be deposited and doped to form fourth conductive layer 32. A deposition process such as LPCVD, CVD, or pulse plasma CVD, using $SiH_4$ as the reactant gas and in-situ deposition to dope an N-type dopant, such as phosphorus, may be used to form fourth conductive layer 32. Other deposition techniques may be employed to form doped polysilicon material in trench 12. The deposition process may be followed by an etch-back process to remove excessive polysilicon deposited on other areas and adjust the level of the polysilicon material inside trench 12.

Figure 16:
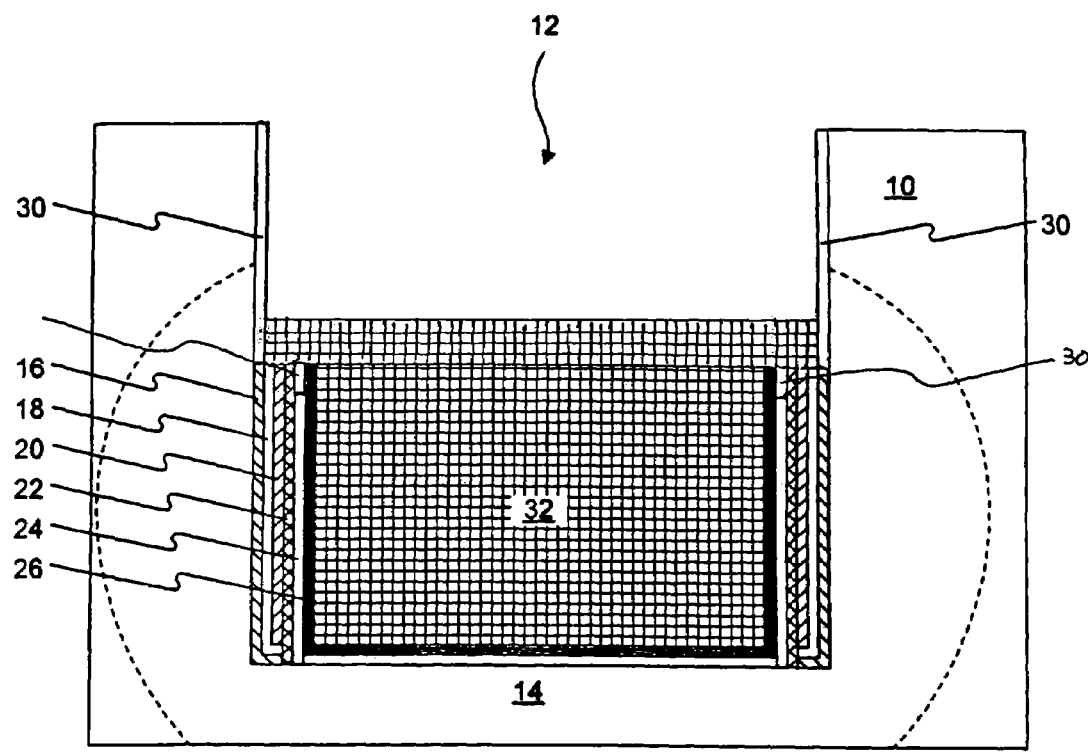

Referring to FIG. 16, after fourth conductive layer 32 is formed in trench 12, an optional process may be added to enhance the quality of fifth dielectric layer 30 formed on the upper sidewalls of trench 12. In the example where fifth dielectric layer 30 contains silicon oxide, a thermal oxidation may be performed to increase the thickness, quality, and characteristics of the silicon oxide. Alternatively, a deposition process may be employed to form additional dielectric materials on the upper sidewalls of trench 12, and become part of fifth dielectric layer 30. However, an additional etching process may need to be performed to remove dielectric materials that are not deposited only on the upper sidewalls of trench 12. Fifth dielectric layer 30 should be made thick enough, or with sufficient quality, to prevent vertical leakage current.

Figure 17B:
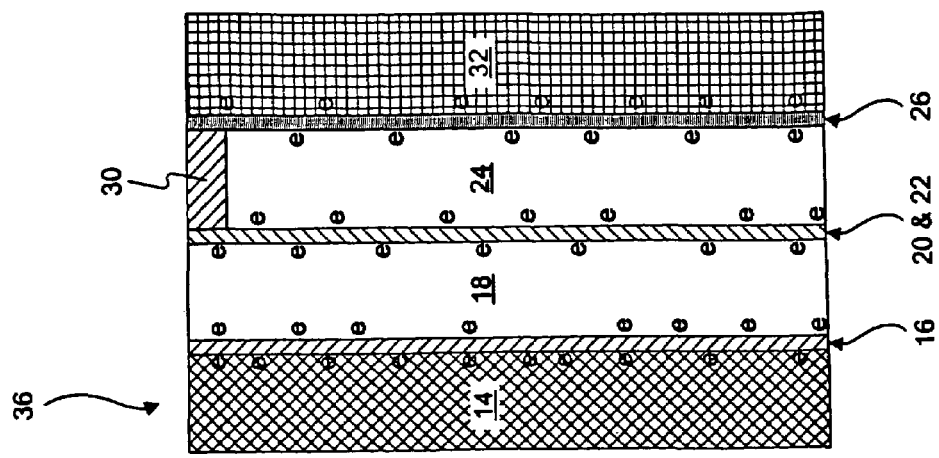
FIG. 17B shows an enlarged cross-sectional view of an area shown in FIG. 17A to illustrate a stack film structure consistent with one embodiment of the present invention.
Figure 17A:
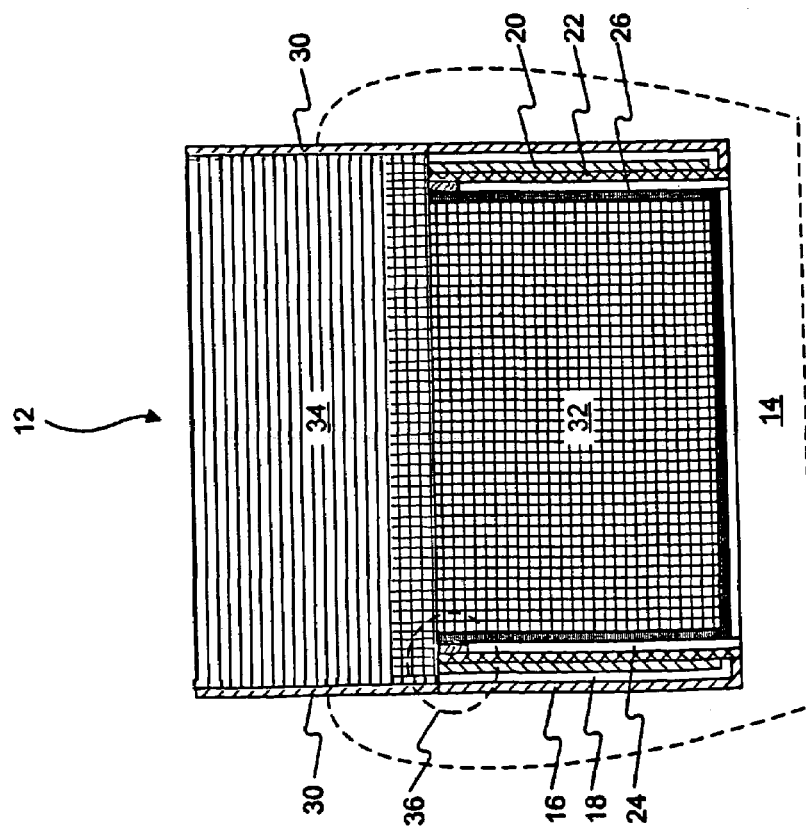

Referring to FIG. 17A, a fifth conductive layer 34 is formed on and contiguous with fourth conductive layer 32. Fifth conductive layer 34 may fill the entire trench 12. Fifth conductive layer 34 is electrically coupled to fourth conductive layer 32, and also second conductive layer 18. Second conductive layer 18, fourth conductive layer 32, and fifth conductive layer 34 together serve as the storage node of the trench capacitor. As an example, polysilicon may be deposited and doped to form fifth conductive layer 34. In forming fifth conductive layer 34, the same process described above for forming fourth conductive layer 32 may be used.

The embodiments described above in the method of the present invention may be used to form trench capacitor 50 illustrated in FIGS. 1 and 2. In electrode 52, first conductive area 14 is provided as outer crown 52a, third conductive layer 24 is provided as inner crown or vertical extension 52b. In storage node 54, second conductive layer 18 is provided as first extension 54a, fourth conductive layer 32 is provided as second extension 54b, and fifth conductive layer 34 is provided as base portion 54c to electrically couple first extension 54a and second extension 54b. Dielectric layer 56 may be composed of first dielectric layer 16, second dielectric layer 20, third dielectric layer 22, and fourth dielectric layer 26. Dielectric layer 56 may also include a portion of fifth dielectric layer 30 that insulates the top of third conductive layer 24 from storage node 54. Collar 58 is composed of fifth dielectric layer 30 discussed above to prevent vertical leakage current in trench capacitor 50.

The method for manufacturing a trench capacitor discussed above may be characterized according to the structure provided in FIGS. 1 and 2. In one embodiment, the method includes providing first conductive area 52a of electrode 52 in a substrate 10 surrounding trench 12, and providing second conductive area 52b of electrode 52. Second conductive area 52b includes a loop in the shape of a vertical wall extending from a bottom of trench 12. Second conductive area 52b is electrically coupled to first conductive area 52a, and is spaced horizontally apart from first conductive area 52a.

In addition, the method also includes providing first conductive extension 54a of storage node 54 and providing second conductive extension 54b of storage node 54. First conductive extension 54a extends into a first dielectric space provided between first conductive area 52a and second conductive area 52b of electrode 52, as shown in FIG. 1. Further, second conductive node 54b extends into a second dielectric space provided within second conductive area 52b of electrode 52a. The method further includes providing dielectric layer 56 to electrically insulate electrode 52 from storage node 54. In one embodiment, collar 58 is provided to surround the upper sidewall of storage node 54 to electrically insulate storage node 54 from the substrate 10.

FIG. 17B shows an enlarged cross-sectional view of area 36 shown in FIG. 17A. Area 36 comprises four conductive layers, first conductive area 14, second conductive layer 18, third conductive layer 24, and fourth conductive layer 32, and three layers of dielectrics, first dielectric layer 16, a combination of second dielectric layer 20 and third dielectric layer 22, and fourth dielectric layer 26. The dielectric layers are provided within the spaces between the conductive layers. An example of a stack film with SIMISIS (silicon-interlayer-metal-interlayer-silicon-interlayer-silicon) structure, therefore, may be formed with the aforementioned method.

After the trench capacitor is formed, conventional processing steps may be used to form conductive layers and insulators to provide wirings and other devices or circuits on substrate 10. For example, additional steps may be employed to connect the trench capacitor to a transistor to complete the formation of memory cell arrays. Those additional steps may include, but are not limited to, depositing a polysilicon layer, a metal layer, or both; defining wiring patterns; and forming insulations between and over the wirings.

It will be apparent to those skilled in the art that various modifications and variations can be made in the disclosed device and method without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A trench capacitor, comprising:
   an electrode including
      a first conductive area formed in a trench provided in a substrate, and
      a second conductive area extending from a bottom of the trench, the second conductive area being electrically coupled to the first conductive area and spaced horizontally apart from the first conductive area;
   a storage node including
      a first conductive extension extending into a first dielectric space provided between the first conductive area and the second conductive area of the electrode, and a second conductive extension extending into a second dielectric space provided within the second conductive area of the electrode; and a dielectric layer electrically insulating the electrode from the storage node.

2. The trench capacitor of claim 1, wherein the first conductive area comprises a portion of a doped substrate and surrounds a sidewall of the trench.

3. The trench capacitor of claim 1, wherein the trench capacitor further comprises a collar provided at an upper sidewall of the storage node to electrically insulate the storage node from the substrate.

4. A trench capacitor formed in a trench formed within a semiconductor substrate, comprising:

an electrode having a double-crown structure including
   an outer conductive crown comprising a doped semiconductor substrate, and
   an inner conductive crown spaced apart from the outer conductive crown and electrically coupled to the outer conductive crown;

a storage node extending into a first dielectric space formed between the outer conductive crown and the inner conductive crown and extending into a second dielectric space formed within the inner conductive crown; and a dielectric layer electrically insulating the electrode from the storage node.

5. The trench capacitor of claim 4, wherein the inner conductive crown comprises a loop in the shape of a vertical wall extending from a bottom of the trench, and the inner conductive crown is spaced horizontally apart from the outer conductive crown.

6. The trench capacitor of claim 4, wherein the outer conductive crown comprises a portion of a doped substrate surrounding a sidewall of the trench.

7. The trench capacitor of claim 4, wherein the trench capacitor further comprises a collar surrounding an upper sidewall of the storage node to electrically insulate the storage node from the substrate.

8. A trench capacitor formed in a trench within a semiconductor substrate, comprising:

an electrode having a plurality of electrode prongs, each of the electrode prongs being electrically coupled to the other electrode prongs, wherein at least one electrode prong is comprised of a portion of a doped substrate;

a storage node having a plurality of storage node prongs, each of the storage node prongs being electrically coupled to the other storage node prongs, at least one of the storage node prongs extending into a dielectric space provided between two of the electrode prongs; and a dielectric layer electrically insulating the electrode from the storage node.

9. The trench capacitor of claim 8, wherein the at least one electrode that is comprised of the portion of the doped substrate additionally comprises a lower portion of the substrate and surrounds a sidewall of the trench.

10. The trench capacitor of claim 8, wherein the trench capacitor further comprises a collar surrounding an upper sidewall of the storage node to electrically insulate the storage node from the substrate.

11. The trench capacitor of claim 8, wherein the electrode is U-shaped.

12. The trench capacitor of claim 8, wherein the storage node is U-shaped.

* * * * *

UNITED STATES PATENT AND TRADEMARK OFFICE
CERTIFICATE OF CORRECTION

PATENT NO. : 7,030,442 B2  Page 1 of 1
APPLICATION NO. : 10/965160
DATED : April 18, 2006
INVENTOR(S) : Yu-Ying Liang It is certified that error appears in the above-identified patent and that said Letters Patent is hereby corrected as shown below:

Title page, item (12) "Lian" should read --Liang--.

Title page, item (75), "Lian," should read --Liang,--.

Signed and Sealed this

Eighth Day of August, 2006

JON W. DUDAS
*Director of the United States Patent and Trademark Office*